United States Patent
Ashjaee et al.

(10) Patent No.: US 6,482,307 B2
(45) Date of Patent: Nov. 19, 2002

(54) METHOD OF AND APPARATUS FOR MAKING ELECTRICAL CONTACT TO WAFER SURFACE FOR FULL-FACE ELECTROPLATING OR ELECTROPOLISHING

(75) Inventors: Jalal Ashjaee, Cupertino, CA (US); Boguslaw A. Nagorski, San Jose, CA (US); Bulent M. Basol, Manhattan Beach, CA (US); Homayoun Talieh, San Jose, CA (US); Cyprian Uzoh, Milpitas, CA (US)

(73) Assignee: NuTool, Inc., Milpitas, CA (US)

( * ) Notice: Subject to any disclaimer, the term of this patent is extended or adjusted under 35 U.S.C. 154(b) by 61 days.

(21) Appl. No.: 09/735,546

(22) Filed: Dec. 14, 2000

(65) Prior Publication Data
US 2001/0035354 A1 Nov. 1, 2001

Related U.S. Application Data
(60) Provisional application No. 60/203,944, filed on May 12, 2000.

(51) Int. Cl.[7] .............................. C25D 5/18; C25D 5/00; C25D 7/12; B23H 3/00
(52) U.S. Cl. ...................... 205/103; 205/137; 205/149; 205/157; 205/652; 205/654; 205/662; 205/663; 205/686
(58) Field of Search ................................ 205/137, 149, 205/157, 103, 652, 654, 662, 663, 686

(56) References Cited

U.S. PATENT DOCUMENTS

| | | | |
|---|---|---|---|
| 3,328,272 A | 6/1967 | Creutz et al. ................ 204/52 |
| 4,430,173 A | 2/1984 | Boudot et al. ............. 204/52 R |
| 4,948,474 A | 8/1990 | Miljkovic ................ 204/52.1 |
| 4,954,142 A | 9/1990 | Carr et al. .................... 51/309 |
| 4,975,159 A | 12/1990 | Dahms ........................ 204/15 |
| 5,084,071 A | 1/1992 | Nenadic et al. .............. 51/309 |
| 5,256,565 A | 10/1993 | Bernhardt et al. .......... 437/228 |

(List continued on next page.)

FOREIGN PATENT DOCUMENTS

| WO | 98/27585 | 6/1998 |
|---|---|---|
| WO | WO 00/26443 | 5/2000 |

OTHER PUBLICATIONS

James J. Kelly et al., "Leveling and Microstructural Effects of Additives for Copper Electrodeposition", Journal of the Electrochemical Society, 146 (7), 1999, pp. 2540–2545. month unavailable.

Joseph M. Steigerwald et al., "Chemical Mechanical Planarization of Microelectronic Materials", A Wiley–Interscience Publication, 1997 by John Wiley & Sons, Inc. pp. 212–222. month unavailable.

Robert D. Mikkola et al., "Investigation of the Roles of the Additive Components for Second Generation Copper Electroplating Chemistries Used for Advanced Interconnect Metalization", 2000 IEEE, IEEE Electron Devices Society, pp. 117–119, Jun. 2000.

*Primary Examiner*—Edna Wong
(74) *Attorney, Agent, or Firm*—Crowell & Moring LLP

(57) ABSTRACT

Deposition of conductive material on or removal of conductive material from a wafer frontal side of a semiconductor wafer is performed by providing an anode having an anode area which is to face the wafer frontal side, and electrically connecting the wafer frontal side with at least one electrical contact, outside of the anode area, by pushing the electrical contact and the wafer frontal side into proximity with each other. A potential is applied between the anode and the electrical contact, and the wafer is moved with respect to the anode and the electrical contact. Full-face electroplating or electropolishing over the wafer frontal side surface, in its entirety, is thus permitted.

28 Claims, 8 Drawing Sheets

U.S. PATENT DOCUMENTS

| | | | |
|---|---|---|---|
| 5,292,399 A | 3/1994 | Lee et al. | 156/643 |
| 5,354,490 A | 10/1994 | Yu et al. | 252/79.1 |
| 5,516,412 A | 5/1996 | Andricacos et al. | 204/224 R |
| 5,605,637 A | 2/1997 | Shan et al. | 216/71 |
| 5,681,215 A | 10/1997 | Sherwood et al. | 451/388 |
| 5,755,859 A | 5/1998 | Brusic et al. | 106/1.22 |
| 5,762,544 A | 6/1998 | Zuniga et al. | 451/285 |
| 5,770,095 A | 6/1998 | Sasaki et al. | 216/38 |
| 5,772,833 A | 6/1998 | Inazawa et al. | 156/345 P |
| 5,773,364 A | 6/1998 | Farkas et al. | 438/692 |
| 5,793,272 A | 8/1998 | Burghartz et al. | 336/200 |
| 5,795,215 A | 8/1998 | Guthrie et al. | 451/286 |
| 5,807,165 A | 9/1998 | Uzoh et al. | 451/41 |
| 5,840,629 A | 11/1998 | Carpio | 438/692 |
| 5,858,813 A | 1/1999 | Scherber et al. | 438/693 |
| 5,884,990 A | 3/1999 | Burghartz et al. | 336/200 |
| 5,897,375 A | 4/1999 | Watts et al. | 438/693 |
| 5,911,619 A | 6/1999 | Uzoh et al. | 451/5 |
| 5,922,091 A | 7/1999 | Tsai et al. | 51/306 |
| 5,930,669 A | 7/1999 | Uzoh | 438/627 |
| 5,933,753 A | 8/1999 | Simon et al. | 438/629 |
| 5,954,997 A | 9/1999 | Kaufman et al. | 252/79.1 |
| 5,985,123 A | 11/1999 | Koon | 205/96 |
| 6,004,880 A | 12/1999 | Liu et al. | 438/629 |
| 6,027,631 A | 2/2000 | Broadbent | 205/137 |
| 6,063,506 A | 5/2000 | Andricacos et al. | 428/546 |
| 6,066,030 A | 5/2000 | Uzoh | 451/41 |
| 6,071,388 A | 6/2000 | Uzoh | 204/297 R |
| 6,074,544 A | 6/2000 | Reid et al. | 205/157 |
| 6,103,085 A | 8/2000 | Woo et al. | 205/143 |
| 6,132,587 A | 10/2000 | Jorne et al. | 205/123 |
| 6,136,163 A | 10/2000 | Cheung et al. | 204/198 |
| 6,156,167 A | 12/2000 | Patton et al. | 204/270 |
| 6,159,354 A | 12/2000 | Contolini et al. | 205/96 |
| 6,162,344 A | 12/2000 | Reid et al. | 205/157 |
| 6,176,992 B1 | 1/2001 | Talieh | 205/87 |
| 6,217,734 B1 * | 4/2001 | Uzoh | 205/118 |

* cited by examiner

US 6,482,307 B2

METHOD OF AND APPARATUS FOR MAKING ELECTRICAL CONTACT TO WAFER SURFACE FOR FULL-FACE ELECTROPLATING OR ELECTROPOLISHING

This application claims the priority of U.S. provisional application no. 60/203,944, filed May 12, 2000, the disclosure of which is expressly incorporated by reference herein.

BACKGROUND OF THE INVENTION

Multi-level integrated circuit (IC) manufacturing requires many steps of metal and insulator film depositions followed by photoresist patterning and etching or other means of material removal. After photolithography and etching, the resulting wafer or substrate surface is non-planar and contains many features such as vias, lines or channels. Often, these features need to be filled with a specific material such as a metal or other conductor. Once filled with a conductor, the features provide the means to electrically interconnect various parts of the IC.

Electrodeposition is a technique used in IC manufacturing for the deposition of a highly conductive material, such as copper (Cu), into the features on the semiconductor wafer surface. In electrodeposition or electrochemical plating of semiconductor wafers, electrical contact needs to be made to a wafer seed layer as well as to an electrolyte solution. FIG. 1 is a schematic illustration of a wafer or substrate 16 to be coated with Cu. Features 1 may be vias, trenches, bond pads, etc., and are opened in the dielectric or insulator layer 2. To achieve Cu deposition, a barrier layer 3 is first deposited over the whole wafer surface. Then, a conductive Cu seed layer 4 is deposited over the barrier layer 3. An electrical contact is made to the barrier layer 3 and/or the seed layer 4, the wafer surface is exposed to a Cu plating electrolyte, and a cathodic voltage is applied to the wafer surface with respect to an anode which also makes physical contact with the electrolyte. In this way, Cu is plated out of the electrolyte, onto the wafer surface, and into the features 1.

The terms "wafer" and "substrate" are used interchangeably above and throughout the remaining description. Referring to the example shown in FIG. 1, it is to be understood that the "wafer" or "substrate" referred to includes the wafer WF per se, the dielectric or insulator layer 2, and the barrier layer 3, with or without the seed layer 4. These terms, of course, may also refer to a wafer WF per se, including one or more previously processed layers, a further dielectric or insulator layer, and a further barrier layer, with or without a further seed layer.

The electrical contact to the seed layer and/or the barrier layer is typically made along the periphery of the wafer, which is usually round. This approach works well for thick and highly conductive seed layers and small wafer diameters (e.g. 200 mm) However, the trend in the semiconductor industry is to go to larger wafers (e.g. 300 mm) and smaller feature sizes (smaller than 0.18 microns). Smaller feature sizes, as well as cost considerations, require the use of the thinnest possible seed layers. As the wafer size increases, the plating current value also increases. As the seed layer thickness decreases, the sheet resistance increases, and the voltage drop between the middle and the edge of a large wafer also increases. Therefore, voltage drop becomes a major problem, especially for large wafers with thin seed layers. This voltage drop results in non-uniform Cu deposition on the wafer surface, with deposition in regions near the contacts being typically thicker than in other regions.

One other consideration in Cu plating is the "edge exclusion".

Electrical contact to a wafer seed layer has been made, on a frontal side of the wafer, near the edge of the wafer using contacts that have been mechanically attached to a wafer chuck or spindle. Cu plating heads, such as the one described in commonly assigned, copending U.S. Patent application Ser. No. 09/472,523, filed Dec. 27, 1999, pending, titled WORK PIECE CARRIER HEAD FOR PLATING AND POLISHING, typically use contacts around peripheries of the wafers. Making electrical contact and, at the same time, providing a seal against possible electrolyte leakage, however, is difficult. Moreover making electrical contact in this way is undesirable due to its edge exclusion effect and may require cumbersome frontal sealing to protect the electrode contacts.

FIG. 2 shows a cross sectional view of the contacting scheme utilized in the carrier head of application Ser. No. 09/472,523. Here, the wafer or substrate 16 is contacted by a ring-shaped contact 17 which is sealed by a ring seal 18 against exposure to the electrolyte 9a. The seal 18 also prevents the electrolyte 9a from reaching the back surface of the wafer or substrate 16. Such a contacting scheme extends a distance "W" from the edge of the wafer. The distance "W" is referred to as "edge exclusion" and may typically be 3–7 mm. Minimizing "W" would allow better utilization of the wafer surface for IC fabrication.

Various approaches to providing improved electrical contacts to the surfaces of semiconductor wafers during electrodeposition of conductors or during electro-etching or electro-polishing form the subject matter of commonly assigned, copending U.S. Patent application Ser. No. 09/685,934, filed Oct. 11, 2000, pending, titled DEVICE PROVIDING ELECTRICAL CONTACT TO THE SURFACE OF A SEMICONDUCTOR WORKPIECE DURING METAL PLATING AND METHOD OF PROVIDING SUCH CONTACT. The entire disclosure of copending U.S. Patent application Ser. No. 09/685,934 is incorporated herein by reference as non-essential material. A portion of the disclosure of this copending application, moreover, is reproduced here as background information to facilitate an understanding of the present invention.

A general depiction of one version of a plating apparatus is shown in FIG. 3. This apparatus can also be used for plating and polishing as disclosed in commonly assigned application Ser. No. 09/201,929, filed Dec. 1, 1998, now U.S. Pat. No. 6,176,992, titled METHOD AND APPARATUS FOR ELECTROCHEMICAL MECHANICAL DEPOSITION, and commonly assigned, copending application Ser. No. 09/472,523 mentioned earlier. The disclosure of each of these applications is incorporated by reference herein as non-essential material. The carrier head 10 holds the wafer 16. The wafer has the barrier layer and the seed layer (not shown in FIG. 3) deposited on its surface, and therefore its surface is conductive. The head can be rotated around a first axis 10b. It can also be moved in the x, y, and z directions. A pad 8 is placed on an anode plate 9 across from the wafer surface. The pad surface may itself be abrasive, or the pad may contain an abrasive material. Pad designs and structures form the subject matter of commonly assigned, copending application Ser. No. 09/511,278, filed Feb. 23, 2000, now U.S. Pat. No. 6,414,388, titled PAD DESIGNS AND STRUCTURES FOR A VERSATILE MATERIALS PROCESSING APPARATUS, and commonly assigned, copending application Ser. No. 09/621,969, filed Jul. 21, 2000, now U.S. Pat. No. 6,413,403, titled PAD DESIGNS AND STRUCTURES WITH IMPROVED FLUID DISTRIBUTION. The disclosure of each of these applications is incorporated by reference herein as non-essential material.

Electrolyte 9a is supplied to the wafer surface through openings in the anode plate and the pad as shown by the arrows in FIG. 3. Commonly assigned, copending application Ser. No. 09/568,584, filed May 11, 2000, pending, titled ANODE ASSEMBLY FOR PLATING AND PLANARIZING A CONDUCTIVE LAYER, discloses an anode plate, while commonly assigned, copending application Ser. No. 09/544,558, filed Apr. 6, 2000, now U.S. Pat. NO. 6,354,916, titled MODIFIED PLATING SOLUTION FOR PLATING AND PLANARIZATION, discloses an electrolyte. The disclosure of each of these applications is also incorporated by reference herein as non-essential material. The electrolyte then flows over the edges of the pad into the chamber 9c to be re-circulated after cleaning/filtering/refurbishing. An electrical contact 9d is provided to the anode plate. The anode plate turns around the axis 10c. In some applications, the plate may also be translated in the x, y, and/or z directions. Axes 10b and 10c are substantially parallel to each other. The diameter of the pad 8 is typically smaller than the diameter of the wafer surface exposed to the pad surface, although it may also be larger. The gap between the wafer surface and the pad is adjustable by moving the carrier head and/or the anode plate in the z direction. In one mode of operation, the workpiece (i.e., the wafer or substrate) may be brought close to the pad, without touching the pad. In this mode, during material deposition, the workpiece hydroplanes or floats over the pad or anode. In another mode of operation, the wafer surface and the pad may be in contact. When the wafer surface and the pad are touching, the pressure that is exerted on the wafer and pad surfaces can also be adjusted.

Electrical connection to the wafer surface can be made by way of multiple electrical contacts formed by pins that come up through the pad 8 and touch the wafer surface. Assuming by way of example that it is the structure shown in FIG. 1 that is to be plated, and referring now to FIG. 4, it will be understood that the wafer surface 22 is formed by the exposed surface of the seed layer 4. A magnified view of one of the multiple electrical contacts which can be used is shown in FIG. 4. Holes 24 have been provided in the anode plate 9 to accommodate the pins 20. These pins 20 are electrically isolated from the anode plate 9 by an insulator 26. The insulator may be a ceramic or other appropriate dielectric material. A seal 25 is interposed between the anode plate 9 and the insulator 26. The pins 20 forming the electrical contacts are an integral part of a cathode plate 30, which is also electrically isolated from the anode plate 9 by the insulator 26. The cathode plate 30 is spring loaded by suitable springs 32 which bias or push the rounded tips 20T of the pins 20 towards the wafer surface 22 during the plating operation. Thus, the electrical contacts can slide up under the spring bias and down against the spring bias to adjust dynamically to the carrier head or workpiece location relative to the anode plate.

A roller ball, similar to that which could be used in a ball-point pen, can be incorporated at the tips 20T to prevent scratching the wafer surface. Various additional or alternative electrical contact configurations will be described in connection with FIGS. 10–15. Soft conductive brushes could also be used to make contact to the wafer surface. It is important that the selected contacts do not scratch the wafer surface excessively.

For plating, the electrolyte 9a is supplied to the gap 34 between the pad 8 and the wafer surface 22 and thus is brought into physical contact with the wafer surface and the anode plate. In one mode of operation, the wafer 16 is brought down until its surface 22 makes physical contact to the tips 20T of the pins 20. A potential is applied between the cathode plate 30 and the anode plate 9, making the cathode plate 30 more negative than the anode plate 9. Therefore, the wafer surface is also rendered cathodic through the pins 20. Under applied potential, copper plates out of the electrolyte 9a onto the wafer surface 22. By adjusting the gap 34 between the pad 8 and the wafer surface 22 and/or by adjusting the pressure with which the pad 8 and the wafer surface 22 touch each other, one can achieve just plating, or plating and polishing. For effective polishing it is preferred that the pad 8 have an abrasive surface or that the whole pad 8 is abrasive.

During plating, the wafer or substrate 16 and the anode plate/pad assembly 8, 9 should rotate with respect to one another so that plating takes place uniformly. They may also translate in one or two directions. The electrolyte 9a typically fills any gap 34 between the pad 8 and the wafer surface 22. The electrolyte can be either applied through channels in the anode plate 9 and the pad 8 (not shown in FIG. 4) or, if the gap 34 is large (e.g. 2 mm or larger), provided into the gap 34 from the edges of the wafer.

The pin tips 20T, or the tips of other types of electrical contacts which will be described, may be disposed in close proximity to the wafer surface 22 without touching this surface for other applications. Moreover, under a potential applied between the wafer and the anode plate, copper may be either plated onto or removed from the wafer, depending on the polarity of the wafer. Circuitry used for application and adjustment of the applied potential, and for inverting the polarity of the potential, is well known and commonly used.

In the construction shown in FIG. 5, electrical contact to the wafer surface is made by way of a potential conductive pad 80. This pad 80 is used in place of the multiple pins 20. In this case, an insulating spacer 82 of ceramic or other dielectric material is placed directly over the anode plate 9' between the anode plate 9' and the conductive pad 80. Electrical supply contacts are made to the conductive pad 80 and the anode plate 9', and a cathodic potential is applied to the pad 80, with electrolyte 9a making physical contact to the anode plate 9', the pad 80 and the wafer surface 22. When the substrate or wafer 16 is brought down and engages the pad, it gets energized and Cu plating on the wafer surface 22 commences. The construction shown in FIG. 5 is similar to certain pad designs and structures forming the subject matter of application Ser. No. 09/511,278, filed Feb. 23, 2000, mentioned previously. Additionally, commonly assigned application Ser. No. 09/483,095, filed Jan. 14, 2000, now abandoned, titled SEMICONDUCTOR WORKPIECE PROXIMITY PLATING METHODS AND APPARATUS, discloses conductive pad strips used on cylindrical anodes. In other applications, the potential conductive pad 80 may be allowed to float with respect to the wafer surface 22 during material deposition or removal. The potential, moreover, may be pulsed to produce impulse plating. Again, the circuitry used for pulsing the potential is well known and commonly used.

In both approaches described above and in others which will be described, some Cu plating may take place on the exposed cathodic surfaces besides the wafer surface. In the case of pins, for example, exposed regions of the pins may get coated. In case of a conductive pad, the whole pad may get coated. Therefore, it is of utmost importance to select the right conductive materials to be used for the construction of the electrical contacts and the pads. The materials should be such that plating on the Cu coated wafer surface (i.e. the seed layer 4 of FIG. 1) should be preferable or more efficient than plating on the pad or contact surface. Examples of proper materials for the pads may be various conductive polymers or polymeric materials that are coated with refractory metals such as Ta, alpha Ta, W, Mo or their nitrides. The pins or other electrical contacts can be made of conductive polymers or refractory metals such as Mo, Ta and W; alternatively, the pins or other cathode contacts can be made of any conductive metal such as Cu or Ni, or of a conductive alloy such as Cu—Be, Cu—Ag, Ag—Pt, etc., but these metals or alloys may be coated by a refractory metal or compound and/or a nitride of a refractory metal, such as TaN or TiN, or of a refractory compound. These are just some examples. There are many more materials on which Cu does not deposit efficiently.

By employing an electrical contact or connection to a wafer surface which is distributed all over the surface rather than just at the periphery, the "edge exclusion" discussed earlier in connection with FIG. 2 can be reduced on the wafer. As shown in FIG. 6, eliminating the need for a contact ring to contact the periphery of the wafer permits a reduction of the edge exclusion "d". The seal 18 can be either on the surface 22 of the wafer 16 facing the electrolyte 9a or right at the edge 16a of the wafer. The seal 18 may even be disposed on the surface 35 of the wafer 16 facing away from the electrolyte 9a.

Various electrical contact distributions may be used. FIGS. 7–9 schematically show three possible types of distribution of pins 20 over a cathode plate 30. As a rule, as the number of electrical contacts increases, the voltage drop from the center to the edge of the wafer will become smaller, and the thickness of the plated metal becomes more uniform.

Although Cu has been mentioned as the plated metal, practically any metal or conductive alloy can be plated on a wafer/substrate surface. Also, although an electroplating technique and an electroplating apparatus have been described, the same apparatus can be utilized for electro-etching and/or electro-polishing. In these cases, the polarity of the voltage applied between the anode and cathode plates is reversed, making the substrate surface more positive. An electro-etching electrolyte may be used. Again, the circuitry used for application and adjustment of the voltage, and for inversion of the voltage polarity, is well known and commonly used.

FIG. 10 shows one of a plurality of electrical contacts which may be used as alternatives to, or together with, pins such as the pins 20, or together with other electrical contact configurations, to provide electrical connection to a wafer surface. FIGS. 11–13 and 15 also show additional electrical contact configurations which can be used as alternatives to, or together with, other contact configurations. Each electrical contact as shown in FIG. 10 includes a conductive roller 120, which is preferably spherical in geometry. Rollers having other suitable geometrical shapes, such as cylindrical rollers, may be used. The rollers are preferably coated with a corrosion resistant material such as gold, platinum, palladium, their alloys, or some other appropriate contact alloy material.

The roller 120 may be housed in an arrangement that may include, but is not limited to, a contact spring 122 to supply electrical power from the cathode plate (not shown) to the roller 120. The end of the spring 122 also acts as a bearing surface. The spring 122 allows for a gentle but dynamic loading of the roller 120 on the surface of the workpiece. Each spring 122 biases its respective roller toward the wafer surface. In the configuration shown in FIG. 10, the electrical contact per se is formed by the roller 120 and the spring 122 which supports the roller. Each spring 122 extends between the cathode plate (not shown in FIG. 10), on which the spring is supported in any appropriate fashion, and the roller 120 supported by the spring. Both the spring 122 and the roller 120 are surrounded by an insulator 124 of a ceramic or other appropriate dielectric material that isolates the spring 122 and the roller 120 from an electric field during the process of plating Cu out of the electrolyte. The insulator 124 may be configured similarly to the insulator 26, represented in FIG. 4, but can include a shaped tip 128. The shaped tip 128 and a seal 126 are disposed around the roller 120. The seal 126 may be adhesively or otherwise secured to the inner surface of the shaped tip.

The seal arrangement is such that the roller 120 rotates freely with respect to the seal 126. The electrolyte fluid boundary layer, and, if the electrolyte forming the subject matter of copending application Ser. No. 09/544,558 mentioned above is used, especially the additive in the electrolyte, helps lubricate the roller surface. In addition to housing the roller 120 and the seal 126, the tip 128 also prevents the roller 120 from exposure to the electric field. FIG. 14, which shows one electrical contact with a different configuration in use, indicates an applied electric field by reference characters E. The tip and seal configuration helps prevent or minimize material deposition on the roller 120.

FIG. 11 shows another configuration in which a rolling pad 230 of conducting material (e.g. metal), preferably with a partially spherical shaped surface, is disposed between the contact spring 222 and a spherical roller 220. The roller 220 rests on the shaped rolling pad 230. The shaped tip 228 and the seal 226 cooperate with the spring biased rolling pad 230 to confine the roller 220 while allowing it to rotate freely along any direction. In a manner similar to the roller 120 of FIG. 10, the roller 220 protrudes partly through but is restrained by the perimeter of an end opening in the insulator 224 which surrounds the seal 226, the spring 222, and the rolling pad 230. In the configuration shown in FIG. 11, therefore, the electrical contact per se is formed by the roller 220, the spring 222, and the spring biased rolling pad 230 disposed between the roller and the spring.

FIG. 12 shows that a conductive roller 320 may rest on a support member 330 having, for example, a spherical supporting surface rather than on a rolling pad. Multiple support members could be used beneath the roller 320. Such an arrangement is ideal for self-aligned roller contact. In the configuration shown in FIG. 12, the electrical contact Per se is formed by the roller 320, the spring 322, and the support member 330.

Besides the advantage of self alignment, the rolling friction between the roller 320 and the substrate or workpiece is greatly reduced, especially when the workpiece rotates or translates during the process of plating Cu out of the electrolyte. The reduced friction minimizes undesirable workpiece scratching and damage as well as particulate generation.

Other suitable support member geometries could also be used. For instance the cross section of the support member may be triangular, or the roller support may rest on the knife edge of a support member. In another configuration, shown in FIG. 13, a spherical support 430 is disposed between a conductive rollers pad 432 and the roller 420. In FIG. 13, the electrical contact per se is formed by the roller 420, the conductive spring 422, the conductive spherical support 430, and the spring biased and conductive roller pad 432. FIG. 14 shows the configuration of FIG. 13 in use during conductive material deposition. Also, as shown in FIG. 15, the size of the roller 520 may be different from that of the roller support member 530.

The roller material, the contact spring material, and the like must be such that they do not degrade or dissolve in the electrolyte of interest. It is also desirable that these materials do not degrade the quality of the material deposited. The roller, for example, can not excessively scratch the deposited film or generate very undesirable particulates. Numerous face contacts may be made around the periphery of the wafer. The individual contacts may be discrete and range from 4 to about 2000 in number, depending on size of the substrate. As the size of the wafer or substrate increases, the number of electrical contacts used should also increase. The roller contacts could also be a continuous race track or a track which is split into several elements. For example, the periphery may be divided into quadrants or octets. Each quadrant, etc., may contain many more or less uniformly dispersed roller contacts or contact tips.

Although the foregoing and following description refers to electroplating, the techniques and apparatuses described are directly applicable to an electro-etching or electro-polishing technique or apparatus. In these cases, the polarity of the voltage applied between the anode and cathode plates is reversed, making the substrate surface more positive. A special electro-etching electrolyte also could be used.

SUMMARY OF THE INVENTION

It is a primary object of this invention to provide alternative methods of, and alternative apparatuses for, making electrical contact to a wafer frontal side surface which permits complete or full-face electroplating or electropolishing over the entire wafer frontal side surface. According to one method, an anode having an anode area is provided, and electrical contact to the wafer frontal side, using electrical contacts outside the anode area, is made by pushing the electrical contacts against the wafer. The wafer is moved with respect to the anode and the electrical contacts. Polarities of the anode and the electrical contacts can be reversed to alternatively permit deposition of conductive material on the wafer frontal side and removal of conductive material from the wafer frontal side. At least some of the electrical contacts can slide laterally off of the wafer frontal side while the wafer is moved with respect to the anode and the electrical contacts.

Movement of the wafer with respect to the anode and the electrical contacts can be performed by displacing a carrier head which holds the wafer, by displacing the anode and the electrical contacts, or by both displacing the carrier head which holds the wafer and displacing the anode and the electrical contacts. The electrical contacts can be pushed against and touch the frontal side of the wafer in order to make the electrical contact, or can make electrical contact, without touching the wafer frontal side, by way of a "field effect". The electrical contacts may include any of pins, rollers, wires, and brushes. Pushing the electrical contacts against the wafer can be performed by either moving the wafer toward the contacts or by moving the contacts toward the wafer.

According to another, similar method, conductive material is deposited on or removed from a wafer frontal side of a semiconductor wafer by providing an anode having an anode area which is to face the wafer frontal side, and electrically connecting the wafer frontal side with at least one electrical contact outside of the anode area by pushing the electrical contact and the wafer frontal side into proximity with each other. A potential is applied between the anode and the electrical contact, and the wafer is moved with respect to the anode and the electrical contact. The potential can have a first polarity which produces deposition of the conductive material on the wafer frontal side, and a second potential, having a reversed polarity, can be subsequently applied to remove conductive material. Conversely, the first polarity can be one which produces removal of conductive material from the wafer frontal side, and the second potential can be one which is used to deposit conductive material. Polishing of the conductive material can be performed while applying the potential and moving the wafer with respect to the anode and the electrical contact.

The apparatus for depositing conductive material on or removing conductive material from the wafer frontal side of the semiconductor wafer includes, among other elements, an anode having an anode area which is to face the wafer frontal side. Electrical contacts are located outside of the anode area, and can be electrically connected with the wafer frontal side by pushing the electrical contacts and the wafer frontal side into proximity. As noted above, the wafer can be moved with respect to the anode and the electrical contacts during application of a potential between the anode and the electrical contacts to permit deposition or removal of the conductive material. A contact ring, by which the electrical contacts are supported so as to surround the anode, can be provided, and a porous pad can overlie the anode to permit polishing of the conductive material. The anode area can be either circular or non-circular.

DESCRIPTION OF THE PREFERRED EMBODIMENTS

Figure 1:
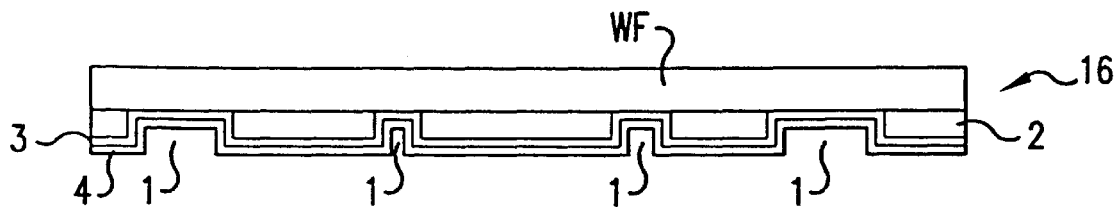
FIG. 1 is an illustration of the known structure of a wafer or substrate to be coated with Cu.
Figure 2:
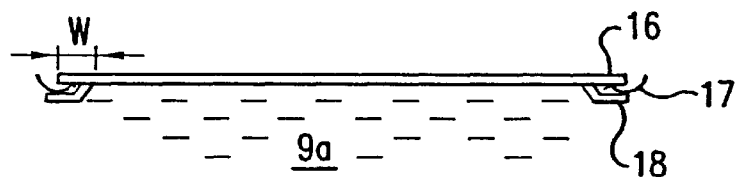
FIG. 2 is a cross sectional side view of one type of a wafer or substrate contacting scheme.
Figure 3:
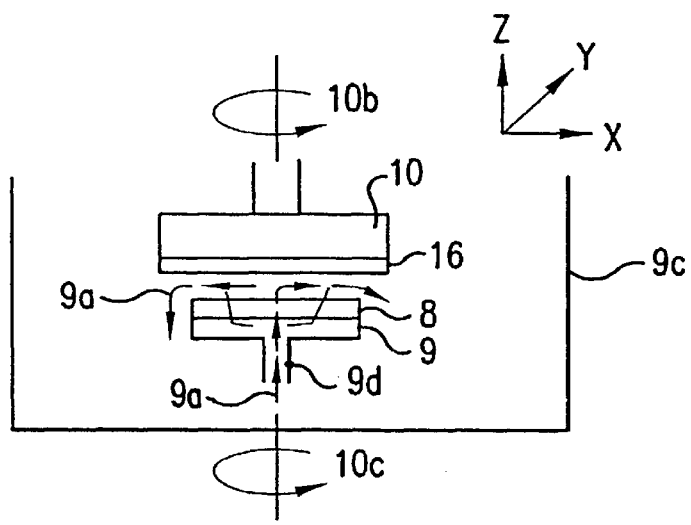
FIG. 3 is a schematic illustration of an overall apparatus in which the present invention may be utilized.
Figure 16:
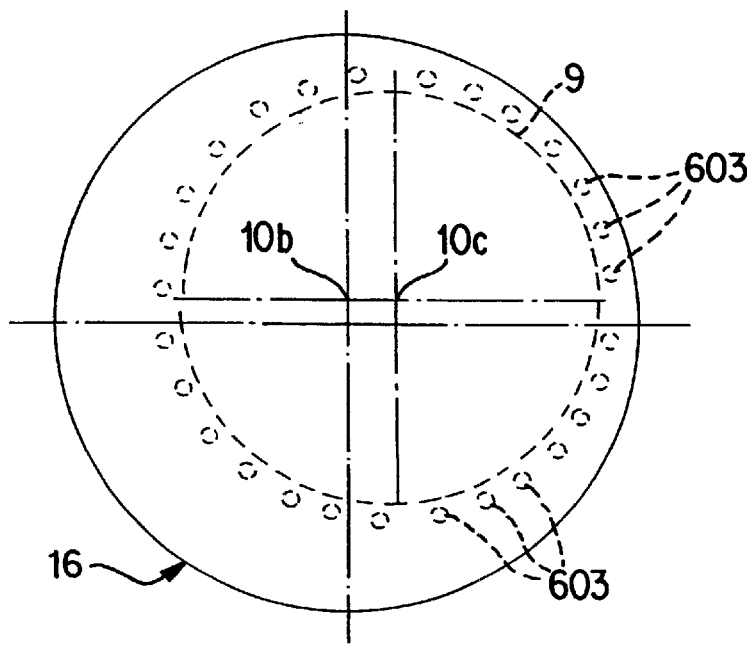
FIG. 16 is a view, from above a wafer or substrate which is to be plated, schematically showing electrical contacts surrounding a circular anode area which can be used according to the present invention.
Figure 17:
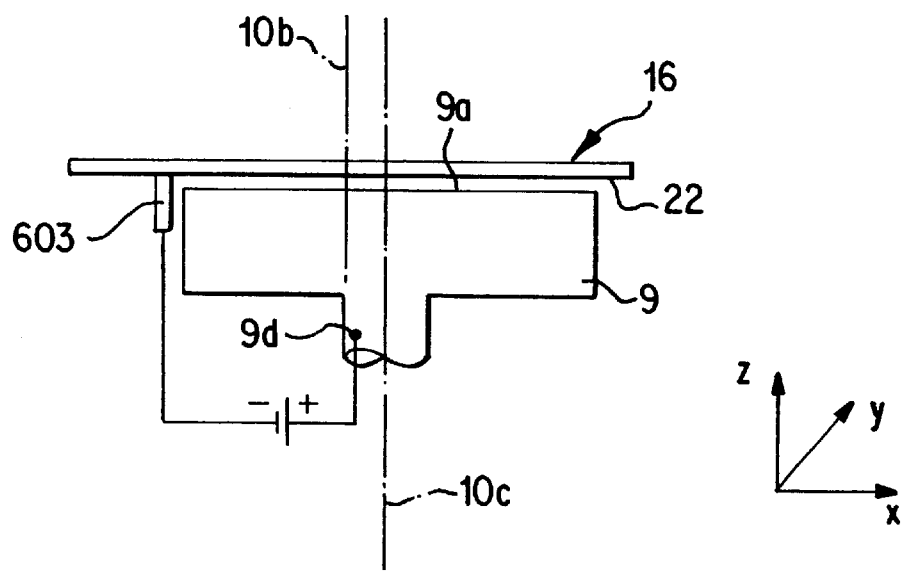
FIG. 17 is a side view of the schematically illustrated assembly of FIG. 16 but in which only one of the electrical contacts is shown for reasons of clarity.

One preferred apparatus which can be used to make electrical contact according to this invention is shown in FIGS. 16 and 17. Electrical contact to the electrolyte 9a is made via an electrode (or anode) in the form of a round anode plate 9 which, as illustrated, has a diameter smaller than the diameter of the wafer or substrate 16. The anode plate 9 of FIGS. 16 and 17 can have essentially the same construction as that of the anode plate 9 of FIG. 3. Holes in the anode plate 9 of FIGS. 16 and 17 for electrical contact pin accommodation, however, are not needed for reasons which will be come clear. As in the plating apparatus shown in FIG. 3, a work piece carrier head (not shown in FIGS. 16 and 17), which holds the wafer 16, can be rotated around a first axis 10b, while the anode plate 9 can turn around a second axis 10c. The carrier head, the anode plate 9, or both, can also be translated in the x, y, and/or z directions. An electrical contact 9d is provided to the anode plate.

Figure 4:
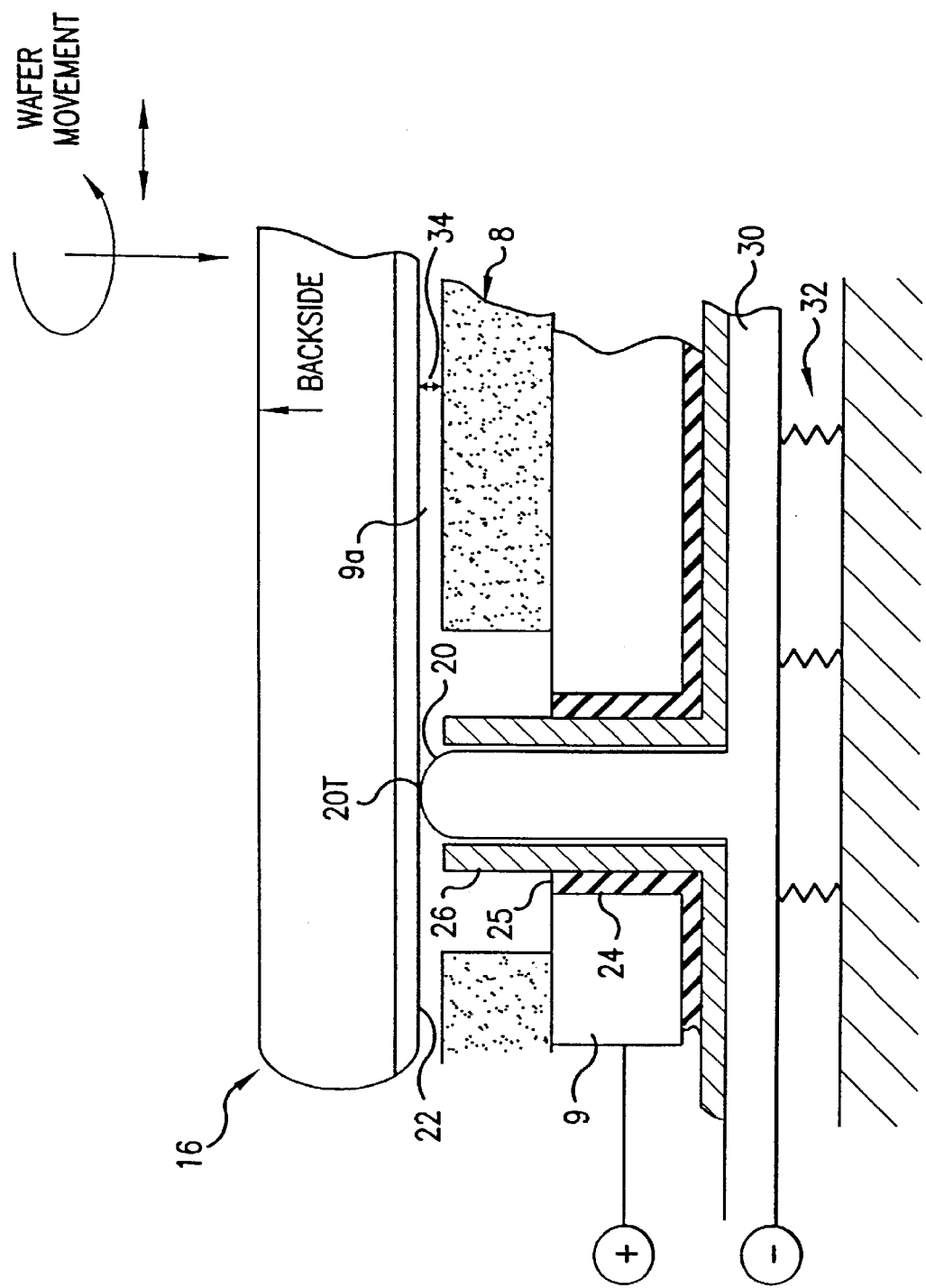
FIG. 4 shows an electrical contact embodiment used in one type of device providing electrical contact to a wafer surface.
Figure 5:
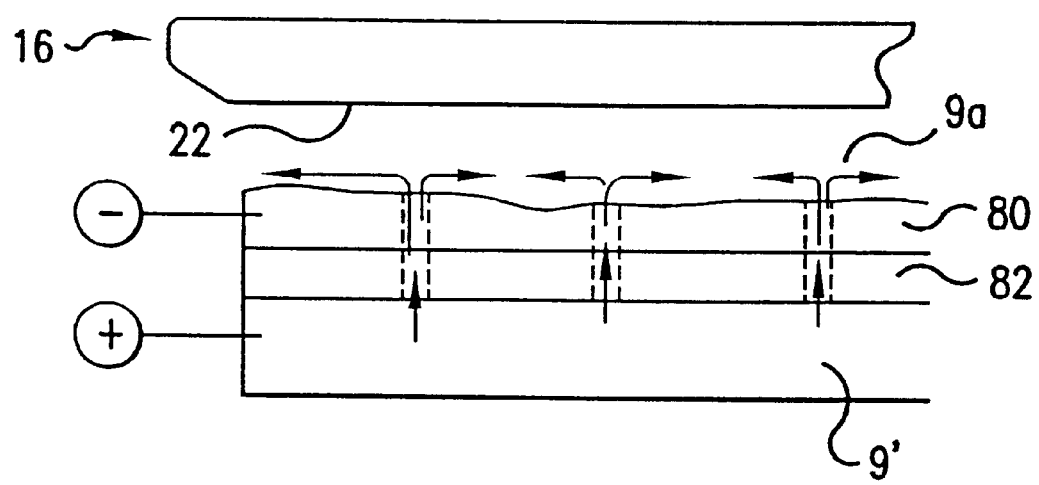
FIG. 5 shows another electrical contact.

Electrical contact to the wafer frontal side 22, rendering the wafer barrier layer and/or the wafer seed layer cathodic, is made outside the anode area via a set of electrical contacts 603. The anode area is shown in phantom in FIG. 16 and, as illustrated, is circular. The electrical contacts surround and are preferably situated concentric with the anode plate 9 as shown in FIG. 16. The wafer 16 is allowed to rotate and move with respect to the anode plate 9 and the wafer contacts 603. In this way, there is no restriction on electrochemical plating all the way to the edge of the wafer 16 or, more particularly, the edge of the seed layer on the wafer. The anode plate 9 may also be allowed to rotate with respect to the contacts 603, but this is not a necessary condition. The electrical wafer contacts 603 could be conductive wires or pins pushed against the wafer, but could also be spherical balls pushed or spring-loaded against the wafer. The electrical wafer contacts 603 Per se of FIGS. 16–18 can have the same structure as any of the electrical contacts previously described in connection with FIGS. 4, 10–13, and 15, and can be constructed of the same materials. Combinations of various previously described electrical contact surfaces are also contemplated. The contacts 603 are mounted on or interconnected with a cathodic element such as a contact ring, similar to that which will be described in connection with FIGS. 20 and 21, rather than with a cathode plate as described in connection with FIG. 4.

The wafer 16, in each embodiment of FIGS. 16–22, can be vacuum mounted, without clamping, to the workpiece carrier head (not shown). One way by which vacuum mounting can be achieved is described in application Ser. No. 09/472,523 mentioned earlier. Other ways of vacuum mounting the wafer to a workpiece carrier head could readily be made and used by those of ordinary skill in the art.

Figure 6:
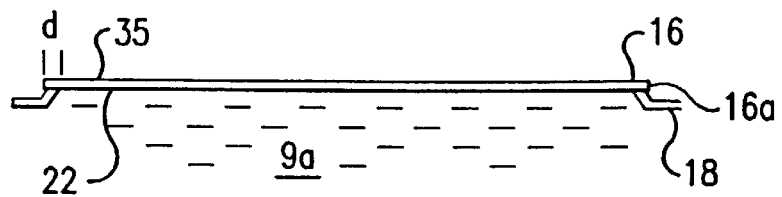
FIG. 6 is a cross sectional side view similar to FIG. 2 but showing a reduction in wafer edge exclusion.
Figure 7:
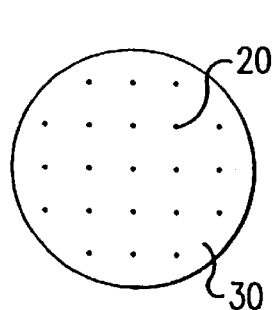
FIGS. 7, 8 and 9 show various individual electrical contact distributions.
Figure 8:
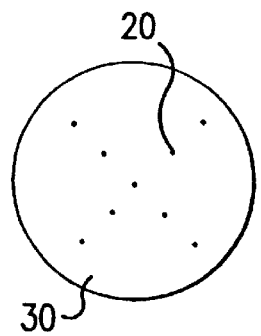
Figure 9:
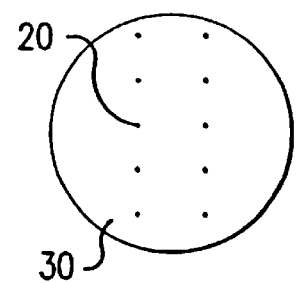
Figure 10:
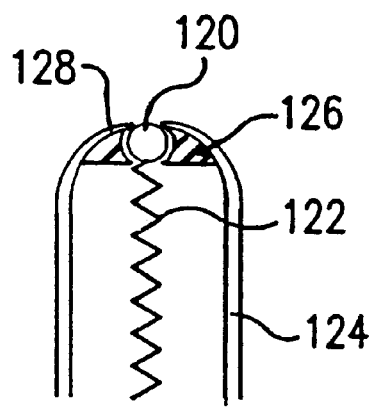
FIG. 10 shows another electrical contact.
Figure 11:
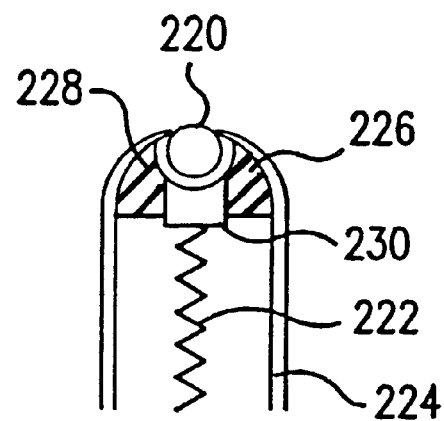
FIG. 11 shows a further electrical contact.
Figure 12:
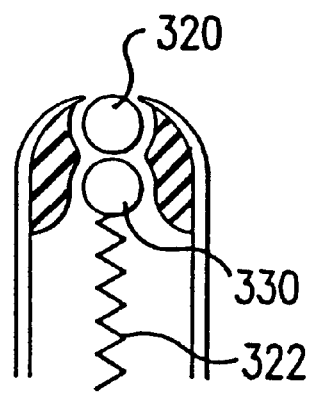
FIG. 12 shows still another electrical contact.
Figure 13:
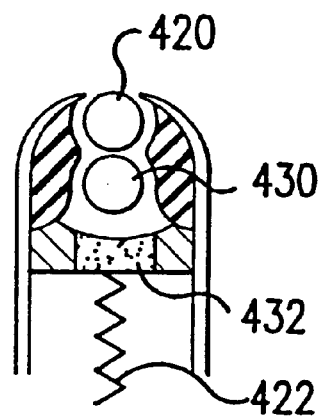
FIG. 13 shows one more electrical contact.
Figure 14:
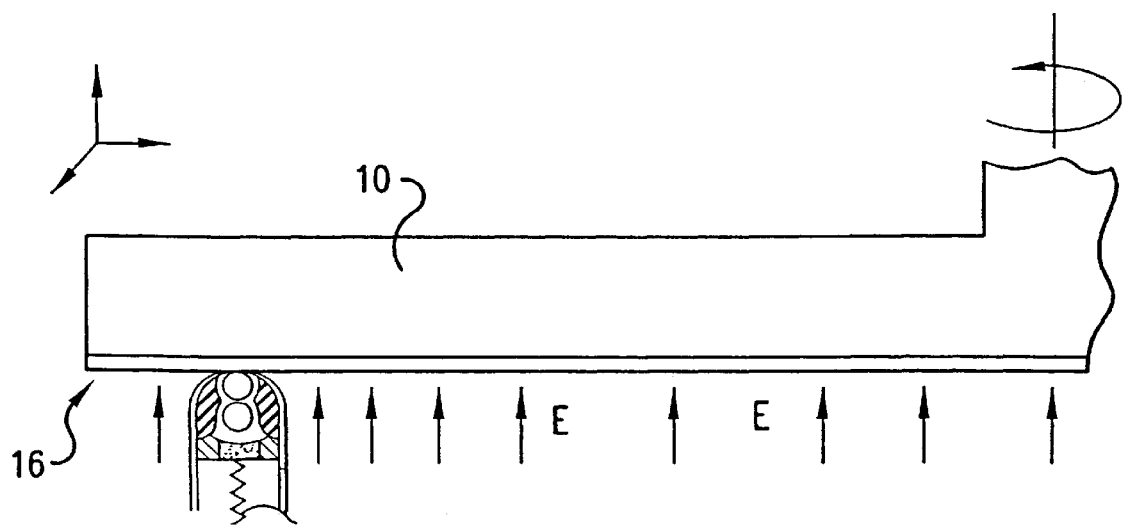
FIG. 14 is a schematic illustration of a single electrical contact such as that shown in FIG. 13 while in contact with a wafer surface during application of an electric field.
Figure 15:
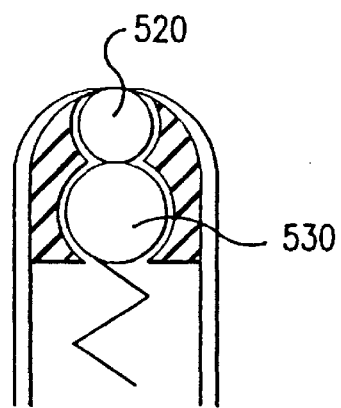
FIG. 15 shows part of another electrical contact which is similar to those of FIGS. 12 and 13 but in which a roller and a roller support member have different sizes.
Figure 18:
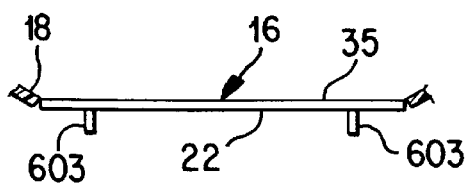
FIG. 18 shows an electrolyte seal location, right at a perimeter edge of a wafer, which permits full wafer face plating with zero edge exclusion.
Figure 19:
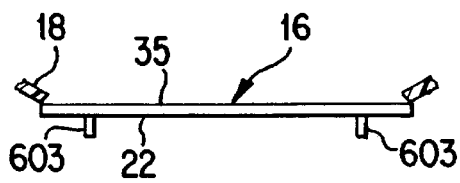
FIG. 19 shows another electrolyte seal location, on a surface of a wafer facing away from an electrolyte, which permits full wafer face plating with zero edge exclusion.

FIGS. 18 and 19 show how the present invention permits full-face plating with zero edge exclusion. A seal 18 can be located right at the perimeter edge of the wafer 16 (FIG. 8) or may even be disposed on the surface 35 of the wafer 16 facing away from the electrolyte (FIG. 19) in a manner similar to that previously described in connection with FIG. 6. The contacts 603, therefore, can sweep the whole wafer frontal side surface 22, and can also slide off of this surface, so as to allow conductive material plating over the whole surface 22.

Figure 20:
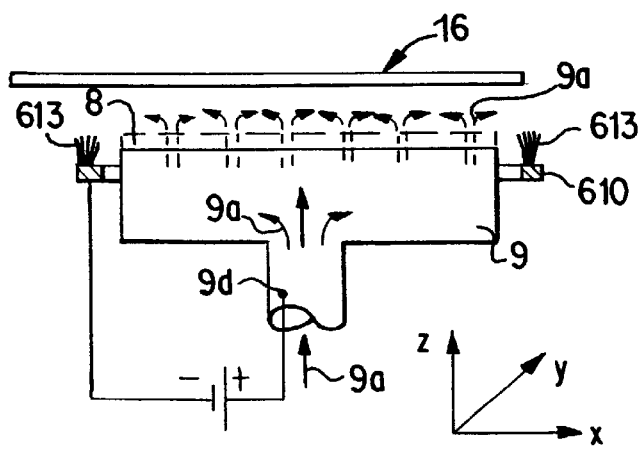
FIG. 20 is a view similar to FIG. 16 but in which electrical contacts with alternative configurations are provided.
Figure 21:
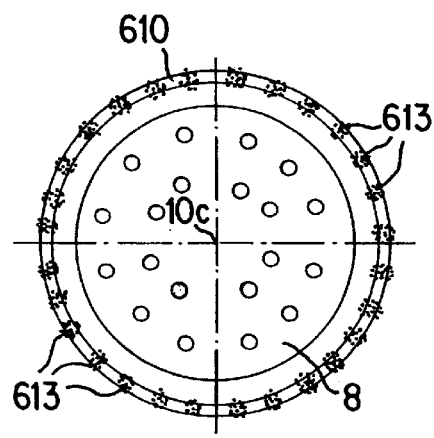
FIG. 21 is a top view of the porous pad overlying the anode plate, and of the electrical contacts, of FIG. 20.

FIGS. 20 and 21 show a preferred electrical wafer contact structure which differs from that of FIGS. 16 and 17. The anode plate 9 illustrated in FIG. 20 is constructed the same as the anode plate 9 of FIGS. 16 and 17. Again, a workpiece carrier head (not shown), which holds the wafer 16, can be rotated around a first axis, while the anode plate 9 can turn around a second axis. The carrier head, the anode plate 9, or both can also be translated in the x, y, and/or z directions. An electrical contact 9d is provided to the anode plate. FIG. 20 also schematically illustrates the flow of the electrolyte 9a through both the anode plate 9 and a porous pad 8, which is also shown in FIGS. 20 and 21. The pad 8 can have an appropriately adapted design similar to any of those disclosed by either U.S. patent application Ser. No. 09/511,278 or U.S. patent application Ser. No. 09/621,969 mentioned previously, and permits through-flow of the electrolyte 9a. The pad 8 is shown in phantom in FIG. 20, since the pad may or may not be provided, depending on the particular operation which is to be performed. No pad is necessary for plating or etching. For plating and polishing, however, a pad 8 is necessary.

A contact ring 610, formed of a conductive metal, a conductive metal alloy, or some other appropriately conductive material, surrounds but is spaced from the perimeter of the anode plate 9. The contact ring 610 could, for example, be connected with a housing within which the anode plate 9 is movable back and forth in the z direction. Electrical contacts, in the form of conductive brushes or any of the previously mentioned conductive pins, wires, balls, rollers, etc., or combinations thereof (conductive brushes 613 are shown in FIGS. 20 and 21), are disposed on or mounted to the contact ring 610 and can be pushed or spring loaded against the wafer frontal side.

As the contact pins, brushes, etc., on the cathode contact ring 610 touch or otherwise electrically interconnect with the wafer surface 22, the wafer 16 is moved with respect to the anode plate 9. The contacts, such as brushes 613, may make physical contact to the surface of the wafer and may be partially or fully displaced off, or outside, of the wafer surface for certain periods of time during plating. This permits control of the conductive material deposit uniformity.

Figure 22:
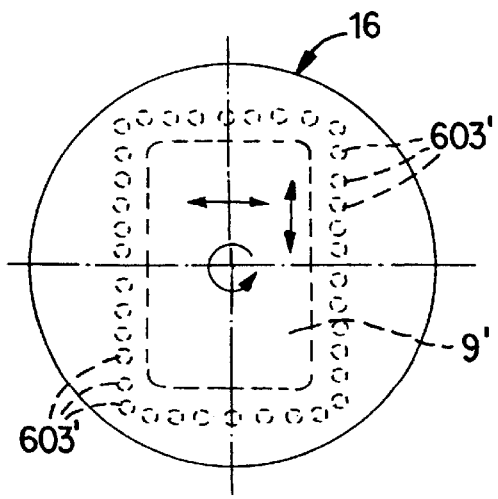
FIG. 22 is a view similar to FIG. 16 but showing one example of a non-circular anode area.

FIG. 22, which is a view similar to FIG. 16, shows that it is possible to have other, differently shaped contact rings and/or anode plate assemblies with non-circular anode areas. FIG. 22 illustrates, by way of example only, a rectangular anode plate 9', a set of electrical contacts 603' arranged in a rectangular configuration around the anode plate 9', and a wafer 16. The anode plate 9', the wafer 16, or both are movable with respect to one another in the directions indicated by arrows to effect proper plating, etching, or plating and polishing operations. Again, the contacts can be, for example, pins with rounded tips, rollers, in the form of brushes, or various combinations of these configurations.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

We claim:

1. A method of contacting a wafer comprising:

providing an electrode having an electrode area, making electrical contact to a wafer frontal side using electrical contacts outside the electrode area, and causing relative movement between said wafer and the electrical contacts while maintaining a portion of the wafer disposed over and within the electrode area and another portion of the wafer outside the electrode area.

2. The method defined in claim 1, wherein polarities of the electrode and the electrical contacts are reversed.

3. The method defined in claim 2 wherein providing the electrode provides an electrode area which is smaller than a surface area of the wafer frontal side.

4. The method defined by claim 2 further comprising introducing a solution to the wafer frontal side only from within the electrode area.

5. The method defined in claim 1, wherein at least some of said electrical contacts can slide laterally off of the wafer frontal side while causing relative movement between said wafer and the electrical contacts.

6. The method defined in claim 5 wherein providing the electrode provides an electrode area which is smaller than a surface area of the wafer frontal side.

7. The method defined by claim 5 further comprising introducing a solution to the wafer frontal side only from within the electrode area.

8. The method defined in claim 1, wherein causing relative movement between said wafer and the electrical contacts is performed by displacing a carrier head which holds the wafer.

9. The method defined in claim 8 wherein providing the electrode provides an electrode area which is smaller than a surface area of the wafer frontal side.

10. The method defined by claim 8 further comprising introducing a solution to the wafer frontal side only from within the electrode area.

11. The method defined in claim 1, wherein causing relative movement between said wafer and the electrical contacts is performed by displacing the electrical contacts.

12. The method defined in claim 11 wherein providing the electrode provides an electrode area which is smaller than a surface area of the wafer frontal side.

13. The method defined by claim 11 further comprising introducing a solution to the wafer frontal side only from within the electrode area.

14. The method defined in claim 1, wherein causing relative movement between said wafer and the electrical contacts is performed by both displacing a carrier head which holds the wafer and displacing the electrical contacts.

15. The method defined in claim 14 wherein providing the electrode provides an electrode area which is smaller than a surface area of the wafer frontal side.

16. The method defined by claim 14 further comprising introducing a solution to the wafer frontal side only from within the electrode area.

17. The method defined in claim 1, wherein said electrical contacts are pushed toward said wafer frontal side of said wafer to make said electrical contact.

18. The method defined in claim 17 wherein providing the electrode provides an electrode area which is smaller than a surface area of the wafer frontal side.

19. The method defined by claim 17 further comprising introducing a solution to the wafer frontal side only from within the electrode area.

20. The method defined in claim 1, wherein said electrical contacts include any of pins, rollers, wires, or brushes.

21. The method defined in claim 20 wherein providing the electrode provides an electrode area which is smaller than a surface area of the wafer frontal side.

22. The method defined by claim 20 further comprising introducing a solution to the wafer frontal side only from within the electrode area.

23. The method defined in claim 1, wherein making electrical contact includes pushing said electrical contacts against the wafer, and wherein pushing said electrical contacts against the wafer is performed by moving the wafer toward the contacts.

24. The method defined in claim 23 wherein providing the electrode provides an electrode area which is smaller than a surface area of the wafer frontal side.

25. The method defined by claim 23 further comprising introducing a solution to the wafer frontal side only from within the electrode area.

26. The method defined in claim 1, wherein making electrical contact includes pushing said electrical contacts against the wafer, and wherein pushing said electrical contacts against the wafer is performed by moving the contacts toward the wafer.

27. The method defined in claim 1 wherein providing the electrode provides an electrode area which is smaller than a surface area of the wafer frontal side.

28. The method defined by claim 1 further comprising introducing a solution to the wafer frontal side only from within the electrode area.

* * * * *